United States Patent
Okano et al.

(10) Patent No.: US 7,541,897 B2
(45) Date of Patent: Jun. 2, 2009

(54) DIELECTRIC RESONATOR, VOLTAGE-CONTROLLED OSCILLATOR, AND WIRELESS APPARATUS

(75) Inventors: Takeshi Okano, Omihachiman (JP); Takahiro Baba, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 37 days.

(21) Appl. No.: 11/942,814

(22) Filed: Nov. 20, 2007

(65) Prior Publication Data

US 2008/0106357 A1    May 8, 2008

Related U.S. Application Data

(63) Continuation of application No. PCT/JP2006/311492, filed on Jun. 8, 2006.

(30) Foreign Application Priority Data

Jun. 14, 2005    (JP) .................. 2005-174100

(51) Int. Cl.
- *H01P 7/10* (2006.01)
- *H03B 5/18* (2006.01)
- *H03B 7/12* (2006.01)
- *H04B 1/40* (2006.01)

(52) U.S. Cl. ............... 333/219.1; 331/96; 331/117 D; 331/177 V; 455/75

(58) Field of Classification Search ............ 331/36 C, 331/96, 107 DP, 117 R, 117 FE, 117 D, 177 V; 333/219.1; 455/73, 75, 76

See application file for complete search history.

(56) References Cited

U.S. PATENT DOCUMENTS 7,394,334 B2 *   7/2008   Okano .................. 333/134

FOREIGN PATENT DOCUMENTS

| JP | 08-288714 | 10/1994 |
|----|-----------|---------|
| JP | 10-051212 | 2/1998 |
| JP | 10-284913 | 10/1998 |
| JP | 11-330818 | 11/1999 |
| JP | 2000-505255 | 4/2000 |
| JP | 2002-344204 | 11/2002 |
| JP | 2003-078304 | 3/2003 |
| WO | WO 02/078119 | 10/2002 |

OTHER PUBLICATIONS

International Search Report PCT/JP2006/311492 dated Jul. 20, 2006.
Written Opinion PCT/JP2006/311492 dated Jul. 20, 2006.

* cited by examiner

*Primary Examiner*—David Mis
(74) *Attorney, Agent, or Firm*—Dickstein Shapiro LLP

(57) ABSTRACT

A dielectric resonator having a line pattern that includes an electrode gap that defines a signal input/output portion provided on an open side, and a ground portion provided on a short-circuited side. The length L in a main direction of a portion of the line pattern in which the signal input/output portion and the ground portion face each other is smaller than one quarter the wavelength of a resonant signal of the resonator. A variable-capacitance element is connected to the signal input/output portion. One end of the variable-capacitance element has a positive potential and the other end of the variable-capacitance element has a negative potential.

16 Claims, 7 Drawing Sheets

(A)

(B)

| | L | REFLECTION PHASE AT 38 GHz | QL | Q0 | Qe |
|---|---|---|---|---|---|
| (1) | 0.1 | 100 | 68 | 524 | 78 |
| (2) | 0.15 | 83.0 | 67 | 519 | 76 |
| (3) | 0.2 | 60.9 | 67 | 530 | 77 |
| (4) | 0.25 | 43.0 | 72 | 530 | 83 |
| (5) | 0.3 | 27.6 | 81 | 549 | 95 |

FIG. 6
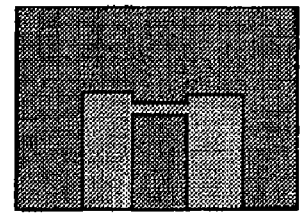
(A)
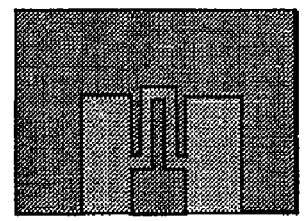
(B)
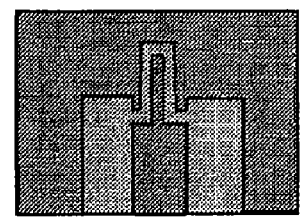
(C)
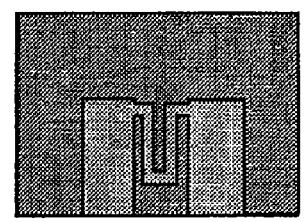
(D)
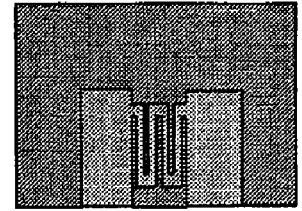
(E)
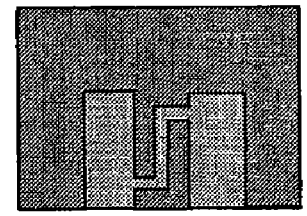
(F)
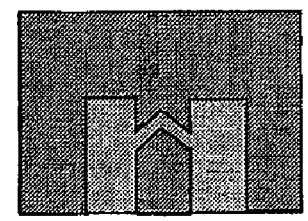
(G)

US 7,541,897 B2

DIELECTRIC RESONATOR, VOLTAGE-CONTROLLED OSCILLATOR, AND WIRELESS APPARATUS

CROSS REFERENCE TO RELATED APPLICATIONS

The present application is a continuation of International Application No. PCT/JP2006/311492, filed Jun. 8, 2006, which claims priority to Japanese Patent Application No. JP2005-174100, filed Jun. 14, 2005, the entire contents of each of these applications being incorporated herein by reference in their entirety.

FIELD OF THE INVENTION

The present invention relates to a dielectric resonator used, for example, in a microwave or millimeter-wave band, to a voltage-controlled oscillator including the dielectric resonator, and to a wireless apparatus including the dielectric resonator.

BACKGROUND OF THE INVENTION

FIG. 1(A) shows a known oscillator. The oscillator includes a dielectric resonator 104 provided on a surface of a dielectric substrate. A signal line and a main line 103 coupled to the resonator are provided on a mount board on which the dielectric resonator 104 is disposed. An electrode gap for DC-cutting (hereinafter, this structure is referred to as a DC-cut structure) 106 is provided in the main line 103. Thus, the main line 103 includes two components 103A and 103B. A negative resistance element 101 is connected to the main-line component 103A, and a termination resistor 102 is connected to the main-line component 103B. Accordingly, a band-reflection-type oscillator is configured (for example, see Patent Document 1).

In addition to the dielectric resonator described above, a waveguide dielectric resonator 110 including a dielectric block 111 having a substantially rectangular parallelepiped shape as shown in FIG. 1(B) is known. A configuration in which openings 113A and 113B are arranged in an outer-surface electrode provided on an outer surface of the dielectric block 111 and in which line patterns (input/output electrodes) 114A and 114B each having one end that is short-circuited with respect to the outer-surface electrode 112 and the other end that is open with respect to the outer-surface electrode 112 are provided in the openings 113A and 113B, respectively, is publicly known (for example, see Patent Document 2).

For each of the resonators described above, an input/output electrode of a dielectric substrate, a dielectric block, or the like (hereinafter, simply referred to as a dielectric member) is connected to a signal line of a mount board and part of an outer-surface electrode of the dielectric member is connected to a ground electrode. Accordingly, an equivalent short-circuited point is provided in the input/output electrode, and the dielectric resonator can thus be excited.

It is known that, in a case where a DC-cut structure is implemented with the provision of an electrode gap in a microstrip line, such as a main line, when each of the main-direction-of-line lengths of portions of lines that face each other across the electrode gap is set to one quarter the wavelength of a passing high-frequency signal, minimum signal loss can be achieved (for example, see Non-Patent Document 1).

Patent Document 1: Japanese Examined Utility Model Registration Application Publication No. 6-48974
Patent Document 2: Pamphlet of International Publication No. WO2002/078119
Non-Patent Document 1: Yoshihiro KONISHI, "Maikuroha Kairo no Kiso to Sono Ouyou (Basics and Applications of Microwave Circuits), p. 318

In the above-described known technology described in Patent Document 1, the signal line and the main line disposed on the mount board are disposed on a portion of the substrate outside the resonator. Thus, the size of the mount board on which the dielectric resonator is disposed tends to be increased, thus increasing the size of the entire device.

In addition, in the known technology described in Patent Document 2, even if the relative positions of an outer-surface electrode and an input/output electrode of a dielectric member are only slightly shifted, the amount of coupling between the dielectric resonator and the input/output electrode is greatly changed. As a result, the amount of coupling with an input/output electrode is likely to vary according to the dielectric resonator used. Thus, in order to reduce the variation in the electric characteristics of a resonator, it is necessary to accurately perform fine adjustment of the outer shape of an input/output electrode after the input/output electrode is formed.

In addition, for such a dielectric resonator, the phase of a reflection signal or a transmission signal from the resonator is fixed in accordance with the distance from a total reflection end (short-circuited point) of the input/output electrode. Thus, fixed constraints may be imposed on the positions and sizes of other circuit elements and lines on the connected mount board. Accordingly, circuit design of the mount board is strictly constrained.

In the known technology described in Non-Patent Document 1, when, with respect to the wavelength of a high-frequency signal propagating in the signal line, the length of comb-like portions of the DC-cut structure is set to one quarter the wavelength of the high-frequency signal, the transmission loss of the signal can be reduced to the minimum. However, if an electrode gap is set to a different length, the transmission loss of the signal significantly increases. Thus, it is necessary to accurately adjust the shape of the power-feeding line.

SUMMARY OF THE INVENTION

The present invention has been designed in view of the problems of the above-described technologies. An object of the present invention is to provide a dielectric resonator that is capable of DC-cutting without requiring a DC-cut element or a signal line having a DC-cut structure to be formed on a mount board, that achieves a reduction in the overall dimension of the dielectric resonator, that facilitates manufacturing, and that eliminates a constraint on circuit design of the mount board on which the resonator is disposed.

Another object of the present invention is to provide a voltage-controlled oscillator that can be used such that the signs of potentials of both ends of a variable-capacitance element are opposite to each other and that has a simple circuit configuration; and a wireless apparatus including the voltage-controlled oscillator.

In order to achieve the above-mentioned objects, a dielectric resonator according to the present invention has the configuration described below.

The dielectric resonator including a dielectric member and an electrode provided on an outer surface of the dielectric member includes a line pattern whose one end is short-circuited with respect to the electrode and whose other end is open with respect to the electrode, the line pattern being provided on a portion of the outer surface of the dielectric member. The line pattern includes an electrode gap that divides the line pattern, a signal input/output portion provided on a side that is open with respect to the electrode, and a ground portion provided on a side that is short-circuited with respect to the electrode.

Since, as described above, the line pattern is provided on the electrode provided on the dielectric member and the electrode gap is provided in the line pattern, the line pattern and the resonator are coupled to each other mainly in accordance with magnetic-field coupling at a total reflection end. Thus, a DC-cut structure can be implemented integrally with the dielectric resonator. Consequently, the overall dimension of the dielectric resonator can be reduced.

Due to the provision of the electrode gap, a capacitance is generated between the signal input/output portion and the ground portion. An adjustment of the shape and gap size of the electrode gap changes the capacitance between the signal input/output portion and the ground portion. Thus, the amount of coupling between the dielectric resonator and the line pattern, which is an input/output electrode, can be adjusted only by adjusting the electrode gap. Consequently, manufacturing can be facilitated.

In addition, the adjustment of the capacitance changes the reflection phase of a high-frequency signal propagating in the line pattern. With the setting of the reflection phase, constraints on the position and size of a circuit element and a power-feeding line of an external mount board can be suppressed. Consequently, the flexibility of design can be improved.

In addition, the dielectric resonator according to the present invention may have the configuration described below.

A main-direction-length of each of portions of the line pattern in which the signal input/output portion and the ground portion face each other with the electrode gap therebetween may be smaller than one quarter the wavelength of a resonant signal of the resonator.

In a case where the facing length in the main-direction-of-line of a DC-cut structure portion (hereinafter, referred to as a facing length) is smaller than one quarter the wavelength of a resonant signal of the resonator, when, for example, a DC-cut structure is provided in a signal line as in a known technology, a coupling Q may be significantly reduced and coupling with the resonator may not be achievable. In the present invention, however, since the DC-cut structure is implemented in the dielectric member, the DC-cut structure is positioned in the vicinity of a total reflection end in which magnetic-field coupling occurs (an original reflection end or a position in the vicinity of the original reflection end), a reduction in the coupling Q can be suppressed. Thus, even if the shape of the signal input/output portion is set such that the facing length is smaller than one quarter the wavelength of the resonant signal, coupling with the resonator can be achieved and the size of a line portion of the DC-cut structure can be reduced. In addition, the reflection phase of a high-frequency signal can be changed with the facing length. Thus, the setting of the reflection phase suppresses the constraints on the position and size of a circuit element and a power-feeding line of an external mount board. Consequently, the flexibility of design can be improved.

In addition, a voltage-controlled oscillator according to the present invention has the configuration described below.

The voltage-controlled oscillator includes a main line connected to the above-described dielectric resonator, the main line being connected to a negative resistance element, the signal input/output portion being connected to a line connected to a variable-capacitance element; and control voltage applying means for applying a positive potential to one end of the variable-capacitance element and for applying a negative potential to the other end of the variable-capacitance element.

Since, as described above, the DC-cut structure is provided in the line pattern of the dielectric resonator, the electrode of the dielectric resonator (generally, connected to a ground electrode) and the line pattern can have different potentials. Thus, each of the potentials of both ends of the variable-capacitance element connected to the line pattern can be made different from the potential (ground potential) of the electrode of the dielectric resonator. For example, a negative potential of one end of the variable-capacitance element and a positive potential of the other end of the variable-capacitance element, each of which is different from the ground potential, can be used. Thus, the absolute value of a voltage to be applied to the variable-capacitance element can be reduced and used.

In addition, a wireless apparatus according to the present invention has the configuration described below.

The wireless apparatus includes the above-described voltage-controlled oscillator provided in a high-frequency signal generator.

According to the present invention, it is not necessary to form a DC-cut element or a signal line having a DC-cut structure on a mount board, the overall dimension of a device can be reduced, and manufacturing can be facilitated. In addition, a constraint on circuit design of the mount board on which a dielectric resonator is disposed can be suppressed. In addition, a DC-cut structure having a simplified circuit configuration can be achieved, and the signs of potentials of both ends of a variable-capacitance element connected to the device can be made different from each other.

BRIEF DESCRIPTION OF THE DRAWINGS

FIG. 6 includes circuit diagrams showing configurations of line patterns according to modifications.

REFERENCE NUMERALS

Figure 1:
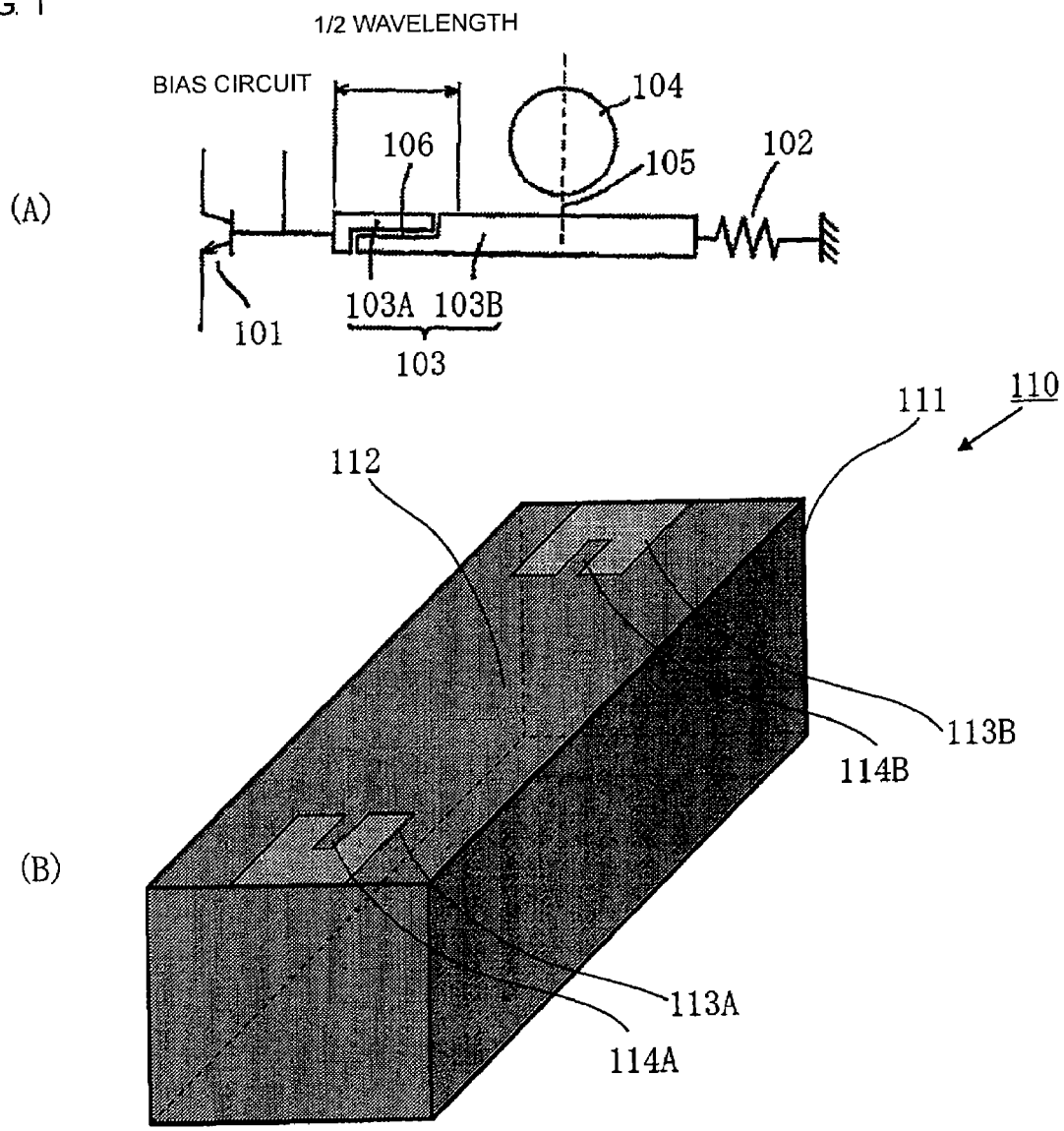
FIG. 1 includes explanatory illustrations of dielectric resonators according to known technologies.

1, 41, 51, 61—dielectric resonator
2, 22, 52, 62—dielectric member
3—circular electrode
53—outer-surface electrode
4, 44, 64—rear-surface electrode 5—slit
6, 46, 56, 66—line pattern
7, 47, 57—opening
8—bump connection portion
9, 49, 59—electrode gap
10, 50, 55—signal input/output portion
11, 51, 54—ground portion
21—mount board
23—signal line
24—ground electrode
25, 27, 48—bump
26—through hole
63—voltage-controlled oscillator
70—termination resistor
73—field-effect transistor
75—microstrip line
76—stub
77—coupled line
78—attenuator
79—variable-capacitance diode

DETAILED DESCRIPTION OF THE INVENTION

Figure 2:
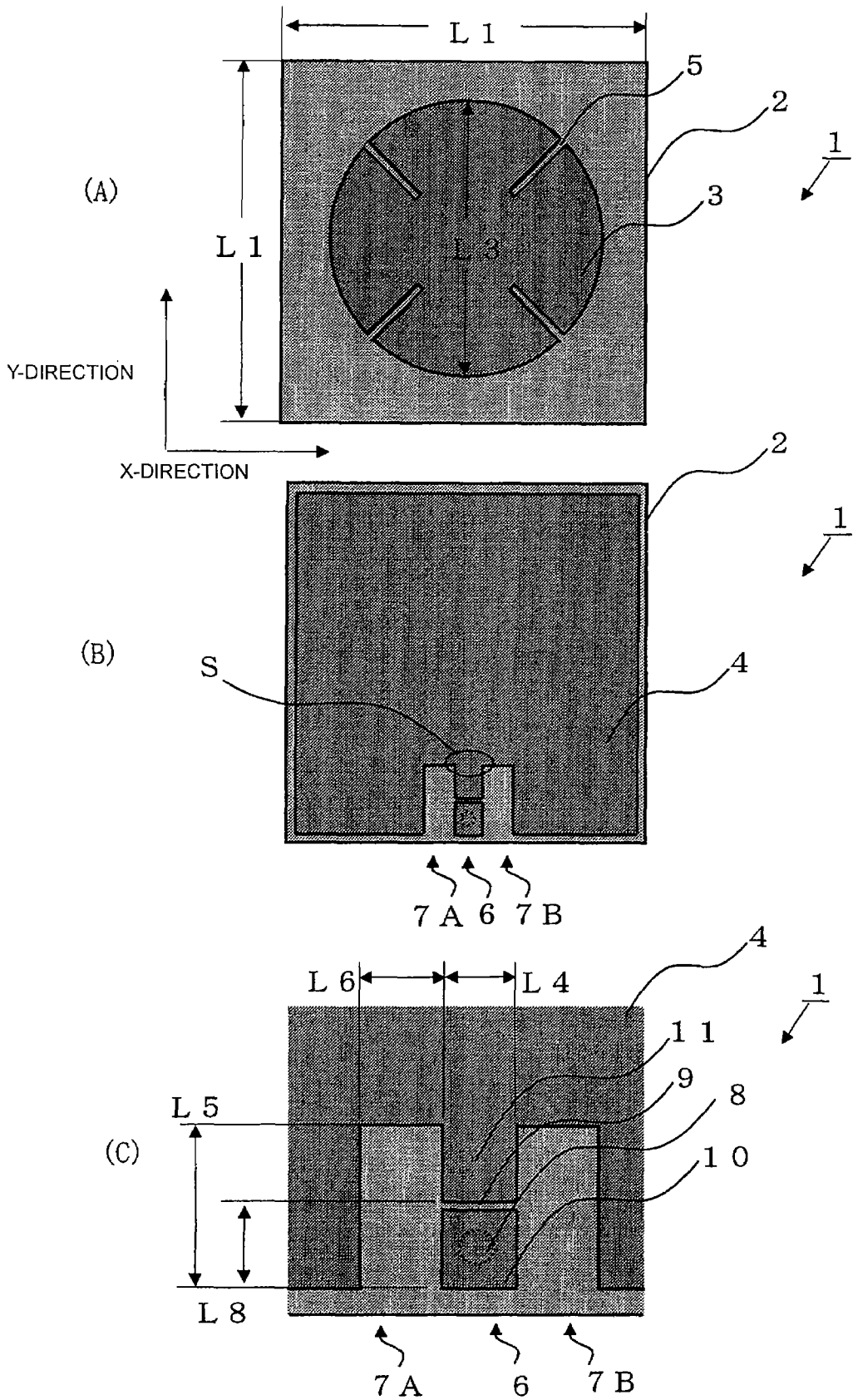
FIG. 2 shows the configuration of a dielectric resonator according to a first embodiment.

A dielectric resonator according to a first embodiment will be described with reference to FIG. 2.

FIG. 2(A) is a top view of a dielectric resonator 1 according to this embodiment. FIG. 2(B) is a bottom view of the dielectric resonator 1. FIG. 2(C) is an illustration in which a line pattern 6 shown in the bottom view of the dielectric resonator 1 is enlarged.

The dielectric resonator 1 is a resonator that resonates mainly in a TM010 mode. The dielectric resonator 1 includes a plate-like dielectric member 2, a substantially circular-shaped circular electrode 3 provided on a top surface of the dielectric member 2 shown in FIG. 2(A), and a rear-surface electrode 4 provided on a mount surface, which is a rear surface of the dielectric member 2 shown in FIG. 2(B). In the dielectric resonator 1, the rear-surface electrode 4 provided on the bottom surface is connected to a ground electrode of a mount board, and a bump provided in a signal line of the mount board is connected to the line pattern 6.

The plate-like dielectric member 2 is made of high dielectric material, such as ceramics exhibiting dielectric constant $\in$. The dielectric member 2 has the same dimension L1 in the longitudinal direction (Y-direction) and the lateral direction in FIG. 2, and the thickness from the top surface to the rear surface of the dielectric member 2 is represented by dimension L2 (not shown).

The circular electrode 3 shown in FIG. 2(A) is provided on the top surface that faces the mount surface. The circular electrode 3 is located in a central portion of the dielectric member 2 and is formed of a conductive thin film made of metal material or the like. The diameter of the circular electrode 3 is represented by dimension L3. Four slits 5 are provided in a radial manner in directions from a central axis portion of the circular electrode 3 to corner portions of the dielectric member 2. The slits 5, which are of a long and narrow groove shape, are disposed at regular intervals with respect to the circumferential direction. The slits 5 are used for setting a resonant frequency of another resonant mode (for example, a TM210 mode or a TM310 mode).

The rear-surface electrode 4 shown in FIG. 2(B) is formed in a rectangular shape on substantially the whole surface covering the mount surface. A portion in which no electrode is disposed is provided in the vicinity of an end face. Accordingly, the rear-surface electrode 4 is provided so as to face the circular electrode 3. An opening portion 7A and an opening portion 7B in which the dielectric member 2 is exposed are provided in the vicinity of the center of one side of the rectangular shape. Thus, the line pattern 6 is provided between the opening portion 7A and the opening portion 7B.

The line pattern 6 and the opening portions 7A and 7B shown in FIG. 2(C) are formed in an oblong shape linearly extending from the vicinity of the center of the one side of the rectangular mount surface toward a central portion of the mount surface. The line pattern 6 is provided between the opening portions 7A and 7B. The line pattern 6 has a dimension in the lateral direction (width dimension) L4 and a dimension in the longitudinal direction (length dimension) L5. Each of the opening portions 7A and 7B has a width dimension L6 and a length dimension L5. The width dimension L6 of each of the opening portions 7A and 7B is greater than the width dimension L4 of the line pattern 6. The length dimension L5 of each of the opening portions 7A and 7B is substantially equal to the length dimension of the line pattern.

The line pattern 6 includes an electrode gap 9. With the provision of the electrode gap 9, the line pattern 6 includes a signal input/output portion 10 that is electrically separated from another electrode and a ground portion 11 that is electrically separated from the signal input/output portion 10 with the provision of the electrode gap 9 and that is connected to the rear-surface electrode 4.

The electrode gap 9 is formed in a groove-like shape. The electrode gap 9 is a groove extending so as to connect both ends at a position that is a predetermined dimension L8 away from an end portion of the line pattern 6 in the Y-direction. With the provision of the electrode gap 9, each of the signal input/output portion 10 and the ground portion 11 has a rectangular shape.

In this embodiment, the dielectric resonator 1 has the above-described configuration. When the dielectric resonator 1 is disposed on the mount board, with the provision of the signal input/output portion 10 in the vicinity of an end face of the mount surface, the dielectric resonator 1 is connected to the signal line of the mount board. When the bump, which is made of gold (Au) or the like and is provided in the signal line of the mount board, is connected to a bump-connecting portion 8 of the input/output electrode portion 10 and a high-frequency signal is input or output, the vicinity of a position S in which the ground portion 11 and the rear-surface electrode 4 are connected to each other operates as a total reflection end of the high-frequency signal.

Figure 3:
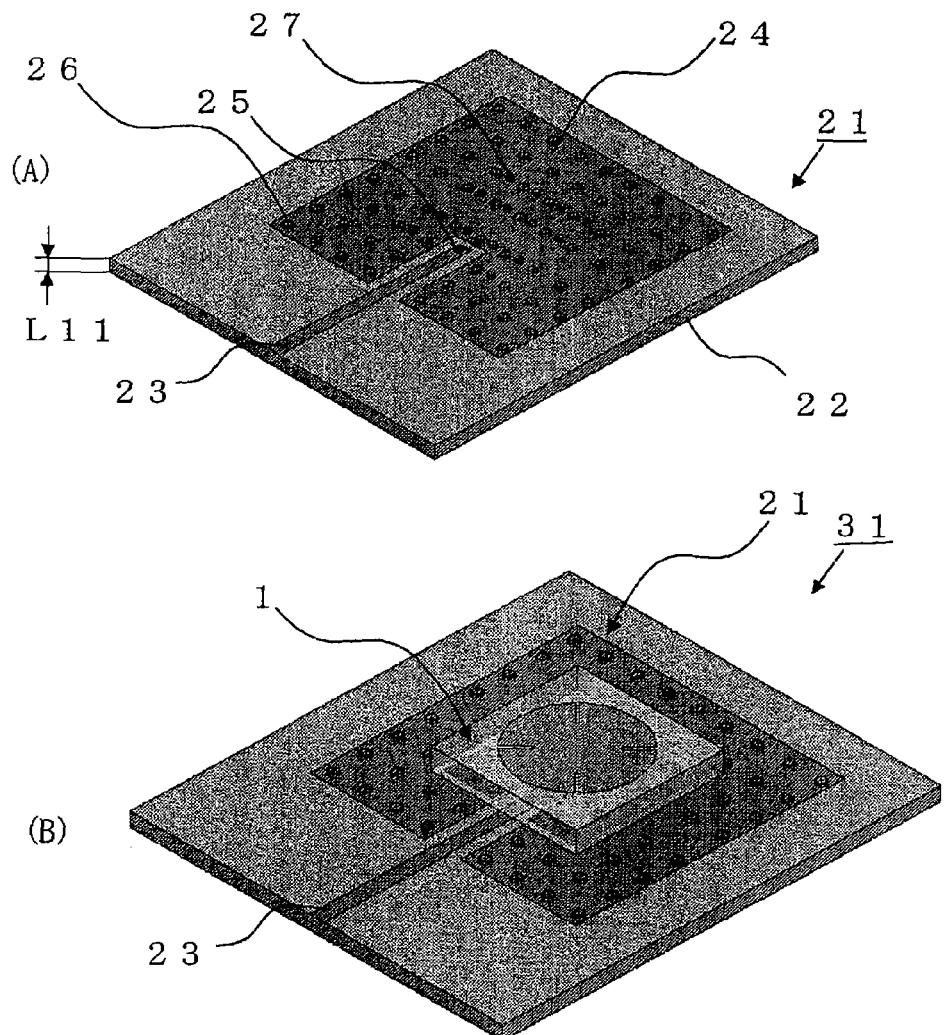
FIG. 3 includes perspective views when the dielectric resonator according to the first embodiment is disposed on a mount board.

FIG. 3(A) is a perspective view of a mount board 21. FIG. 3(B) is a perspective view when the dielectric resonator 1 is disposed on the mount board 21.

The mount board 21 is formed of a dielectric plate 22 that is made of ceramic material having a dielectric constant lower than the dielectric member 2 of the above-described dielectric resonator 1 and that has thickness dimension L11. The mount board 21 includes a signal line 23 connected to the input/output electrode portion 10 when the dielectric resonator 1 is disposed on the mount board 21 and a ground electrode 24 connected to the rear-surface electrode 4 of the dielectric resonator 1. Each of the signal line 23 and the ground electrode 24 is made of conductive material, such as a metal thin film. A bump 25 made of gold (Au) to be connected to the bump-connecting portion 8 of the signal input/output portion 10 of the dielectric resonator 1 is provided in a leading end portion of the signal line 23. Through holes 26 are provided all over the ground electrode 24 at predetermined intervals. The ground electrode 24 is electrically connected to a ground electrode provided on the rear surface of the dielectric plate 22 through the through holes 26. A plurality of bumps 27 are arranged in a portion of the ground electrode 24. Through the bumps 27, the rear-surface electrode 4 of the dielectric resonator 1 is connected to the ground electrode 24.

A high-frequency signal at a resonant frequency of the dielectric resonator 1 is input from the signal line 23. The high-frequency signal input from the signal line 23 is transmitted to the signal input/output portion 10 of the dielectric resonator 1 through the bump 25 and the bump-connecting portion 8. In the signal input/output portion 10, the potential of the electrode gap 9 is changed in accordance with the high-frequency signal, and the ground portion 11 that faces the signal input/output portion 10 with the electrode gap 9 therebetween is also changed. Thus, a capacitance C is generated in the electrode gap 9, which is between the signal input/output portion 10 and the ground portion 11, and the signal input/output portion 10 is coupled to the ground portion 11. Accordingly, a state in which the capacitance is connected in series with the resonator is achieved. Due to the capacitance, the phase (reflection phase) of a signal reflecting in the dielectric resonator 1 when viewed from the signal line 23 is changed.

In addition, when the rear-surface electrode 4 is connected to the ground electrode 24, the portion S in which the ground portion 11 is connected to the rear-surface electrode 4, which is a portion that is dimension L5 away from the end portion of the line pattern 6, serves as an equivalent ground point.

In a case where a high-frequency signal input from the signal line 23 has a resonant frequency of the dielectric resonator 1, the maximum magnetic field is generated in the vicinity of the ground point S. The magnetic field is generated so as to revolve in the main direction of the line pattern 6 (the Y-direction in the figure), that is, so as to coil itself on a plane perpendicular to the main direction.

Then, in the dielectric resonator 1, a magnetic-field vector is generated in a cross-line direction in which a plane perpendicular to the central axis of the circular electrode 3 and the plane perpendicular to the main direction of the line pattern 6. Thus, a magnetic field is generated so as to coil itself on the plane perpendicular to the central axis of the circular electrode 3. Therefore, an electric field in the central-axis direction is generated inside the dielectric member 2 between the rear-surface electrode 4 and the circular electrode 3.

Accordingly, with the provision of the line pattern 6 in a portion of an electrode of the dielectric member 2, a magnetic field generated in the line pattern 6 can be made corresponding to a magnetic field generated inside the dielectric member 2. Thus, magnetic-field coupling between the line pattern 6 and the resonator can be achieved, and the dielectric resonator 1 resonates in the TM010 mode in accordance with a high-frequency signal propagating in the line pattern 6. Since the DC-cut structure can be implemented integrally with the dielectric resonator as described above, the overall dimension of the dielectric resonator can be reduced.

In addition, since the capacitance C is generated in the electrode gap 9, which is between the signal input/output portion 10 and the ground portion 11, provided in the line pattern 6, the DC-cut structure for cutting a direct-current component can be implemented. Thus, for example, it is not necessary to provide a microstrip line having the DC-cut structure or a DC-cut element on the mount board.

In addition, since a configuration in which the capacitance is connected in series with the resonator is achieved, the phase of an output signal can be adjusted only by adjusting the dielectric resonator 1. Thus, the flexibility of design, such as the position and the size of an external mount board and a power-feeding line, can be achieved.

In order to adjust a reflection phase, the size of the capacitance C can be adjusted. In a case where the capacitance is set in accordance with the gap dimension of the electrode gap, the capacitance C is reduced when the gap dimension is increased and the capacitance C is increased when the gap dimension is reduced. Accordingly, the capacitance C can be set.

In addition, with the provision of the line pattern on the mount surface of the dielectric member 2 and the provision of the electrode gap 9 in the line pattern, the variation in the capacitance C between a plurality of dielectric resonators 1 can be reduced compared with a case where a signal line or the like having a DC-cut structure is provided on a mount board. Thus, the electric characteristics of the dielectric resonators 1 can be kept substantially the same. In addition, since the dielectric resonator 1 itself has the DC-cut structure, the circuit configuration of the mount board can be simplified and miniaturized.

Although an example of a resonator in the TM010 mode including a circular electrode and a rear-surface electrode has been described in this embodiment, the present invention is not limited in accordance with the shape of the circular electrode or the rear-surface electrode. The present invention can also be implemented using the waveguide resonator as described in Patent Document 2.

A dielectric resonator according to a second embodiment of the present invention will be described with reference to FIG. 4.

A feature of the dielectric resonator according to this embodiment is that the line pattern used in the above-described first embodiment is divided by an electrode gap having a protruding shape and that the facing length of the protruding portion is smaller than one quarter the wavelength of a resonant frequency.

Figure 4:
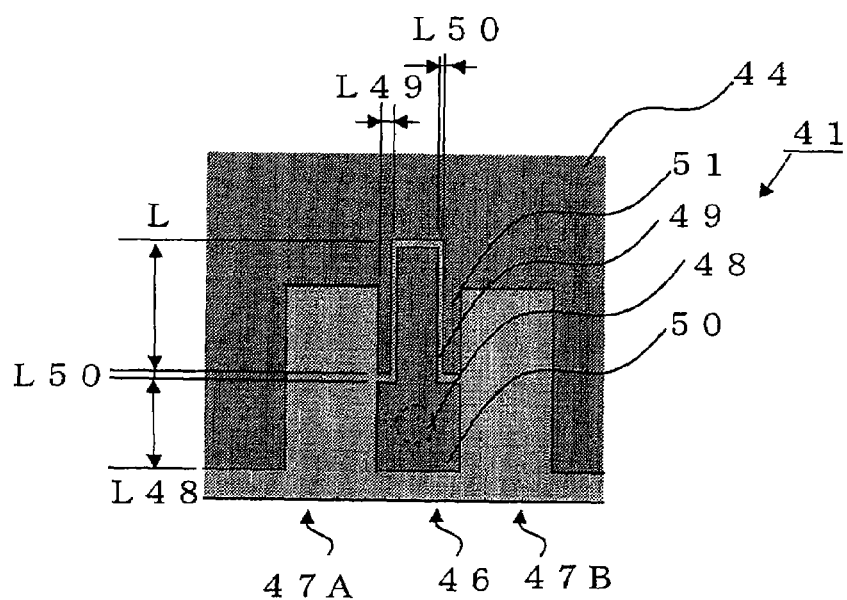
FIG. 4 shows the configuration of a line pattern according to a second embodiment.

FIG. 4 is an illustration in which a line pattern 46 is enlarged in a bottom view of a dielectric resonator 41.

The dielectric resonator 41 has a configuration substantially similar to the dielectric resonator 1 described in the first embodiment. However, the shape of the line pattern 46 is different from that in the first embodiment. As shown in FIG. 4, the line pattern 46 includes an electrode gap 49. The line pattern 46 also includes a signal input/output portion 50 that is electrically separated from another electrode and a ground portion 51 that is electrically separated from the signal input/output portion 50 due to the provision of the electrode gap 49 and that is connected to the rear-surface electrode 44. A bump of a signal line of a mount board is connected to a bump-connecting portion 48 of the signal input/output portion 50.

The electrode gap 49 has a groove-like shape along the whole length having gap dimension L50. The electrode gap 49 protrudes by a predetermined dimension L toward the center of the rear-surface electrode 44 from both side portions that are a predetermined dimension L49 inward from sides of a position a predetermined dimension L48 away in the Y-direction from an end portion of the line pattern 46. In the protruding portion, grooves extending from both sides thereof are connected to each other. With the provision of the electrode gap 49, the signal input/output portion 50 has a protruding shape and the ground portion 51 has a recessed shape.

When the electrode gap 49 protrudes in the main-direction-of-line by the facing length L in the DC-cut structure portion as described above, the capacitance C can be further increased by the facing length L.

The capacitance C can be set by adjusting the facing length L and the gap dimension L50 of the electrode gap 49. An increase in the facing length L increases the capacitance C. A reduction in the facing length L reduces the capacitance C. In addition, an increase in the gap dimension L50 reduces the capacitance C. A reduction in the gap dimension L50 increases the capacitance C. Since the reflection phase differs according to the size of the capacitance C, an adjustment of the capacitance C adjusts the reflection phase.

In this embodiment, the facing length L of the protruding portion is smaller than one quarter the wavelength of a resonant signal of the resonator. In a case where, for example, a power-feeding line has a DC-cut structure as in a known technology, when the facing length L is smaller than one quarter the wavelength of a resonant signal of a resonator, the coupling Q significantly reduces and thus coupling between the resonator and the power-feeding line may not be achievable. However, in a case where a dielectric member has a DC-cut structure as in the present invention, since the DC-cut structure is positioned in the vicinity of a total reflection end in which magnetic-field coupling occurs (an original reflection end or a position in the vicinity of the original reflection end), the reduction in the coupling Q is suppressed. Thus, even if the facing length L is set to be smaller than one quarter the wavelength of the resonant signal, coupling with the resonator can be achieved. Accordingly, a line portion of the DC-cut structure can be miniaturized.

Figure 5:
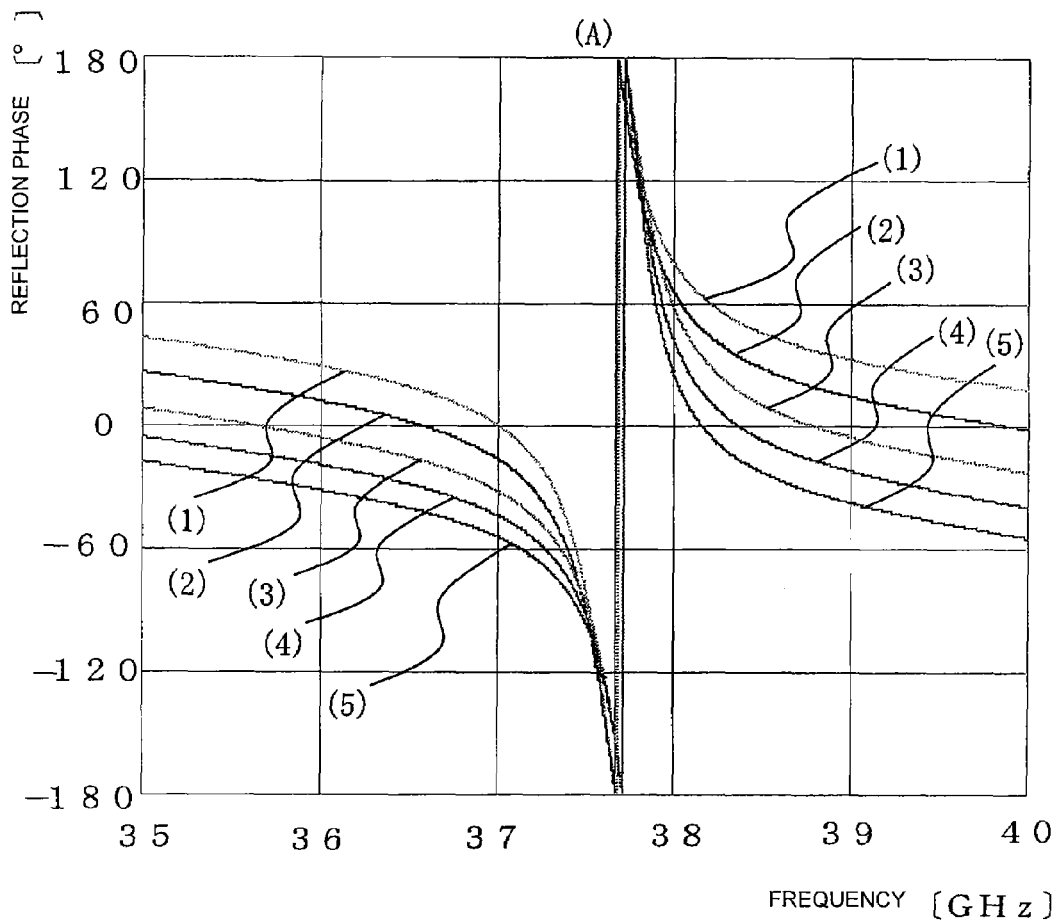
FIG. 5 illustrates the relationship between a facing length L and a reflection phase.

FIG. 5 shows results of analysis of the reflection characteristics of the dielectric resonator according to this embodiment in accordance with electromagnetic-field simulation. In the electromagnetic-field simulation, a reflection phase difference between simulation examples in which the facing length L is varied is confirmed. FIG. 5(A) shows observation results of phase differences between a reflection signal and an input signal obtained in a case where the facing length L is varied. Reflection phase differences at and around a resonant frequency of 38 GHz are shown in FIG. 5(A). FIG. 5(B) shows calculation results of phase differences, loads Q (QL), no-loads Q (Q0), and couplings Q (Qe) at a frequency of 38 GHz. Here, reflection phase differences obtained when the facing length L is varied, such as (1) L=0.1 mm, (2) L=0.15 mm, (3) L=0.2 mm, (4) L=0.25 mm, and (5) L=0.3 mm, are obtained in accordance with simulation. In accordance with the results, the reflection phase difference differs according to the facing length L (1), (2), (3), (4), or (5). A greater phase difference is obtained as the facing length L decreases. A smaller phase difference is obtained as the facing length L increases. The value of a load Q (QL), a no-load Q (Q0), and a coupling Q (Qe) for each facing length L is substantially suitable for practical use. It is confirmed that coupling can be achieved even in a mismatching end.

As described above, in a case where the DC-cut structure is implemented in the dielectric member as in this embodiment, a reduction in the coupling Q can be suppressed. In addition, even if the shape of the signal input/output portion is set such that the facing length is smaller than one quarter the wavelength of a resonant signal, coupling with the resonator can be achieved and the size of a line portion of the DC-cut structure can be reduced.

Although the protruding portion has a shape in which the signal input/output portion protrudes and the ground portion is recessed in the above description, the protruding portion does not necessarily have the shape as described above. The present inventors have confirmed, in accordance with electromagnetic-field simulation, that coupling can be achieved as in this embodiment, even with the protruding portion having a different shape.

For example, as in a modification shown in FIG. 6(A), even in a case where an electrode gap extends such that the position of the electrode gap corresponds to a ground point, that is, the electrode gap extends to a position of a portion in which a line pattern and a rear-surface electrode are connected to each other, the rear-surface electrode operates as a ground portion. Thus, it is confirmed that advantages similar to the above-described advantages can be achieved and coupling can be achieved.

In addition, it is confirmed that advantages similar to the above-described advantages can be achieved and coupling can be achieved even in a case where the entire electrode gap is included in a line pattern as in a modification shown in FIG. 6(B) or even in a case where a protruding portion of an electrode gap extends to a rear-surface electrode portion as in a modification shown in FIG. 6(C).

In addition, it is confirmed that advantages similar to the above-described advantages can be achieved and coupling can be achieved even in a case where an electrode gap has a shape in which a signal input/output portion is recessed and a ground portion protrudes as in a modification shown in FIG. 6(D), in contrast with the example represented in the second embodiment.

In addition, it is confirmed that advantages similar to the above-described advantages can be achieved and coupling can be achieved even in a case where an electrode gap has a meander-line shape including a plurality of protruding portions as in a modification shown in FIG. 6(E).

In addition, it is confirmed that advantages similar to the above-described advantages can be achieved and coupling can be achieved even in a case where an electrode gap has a step-like shape as in a modification shown in FIG. 6(F).

In addition, it is confirmed that advantages similar to the above-described advantages can be achieved and coupling can be achieved even in a case where an electrode gap is cut at a sharp angle as in a modification shown in FIG. 6(G).

A voltage-controlled oscillator according to a third embodiment of the present invention will be described with reference to FIG. 7.

Figure 7:
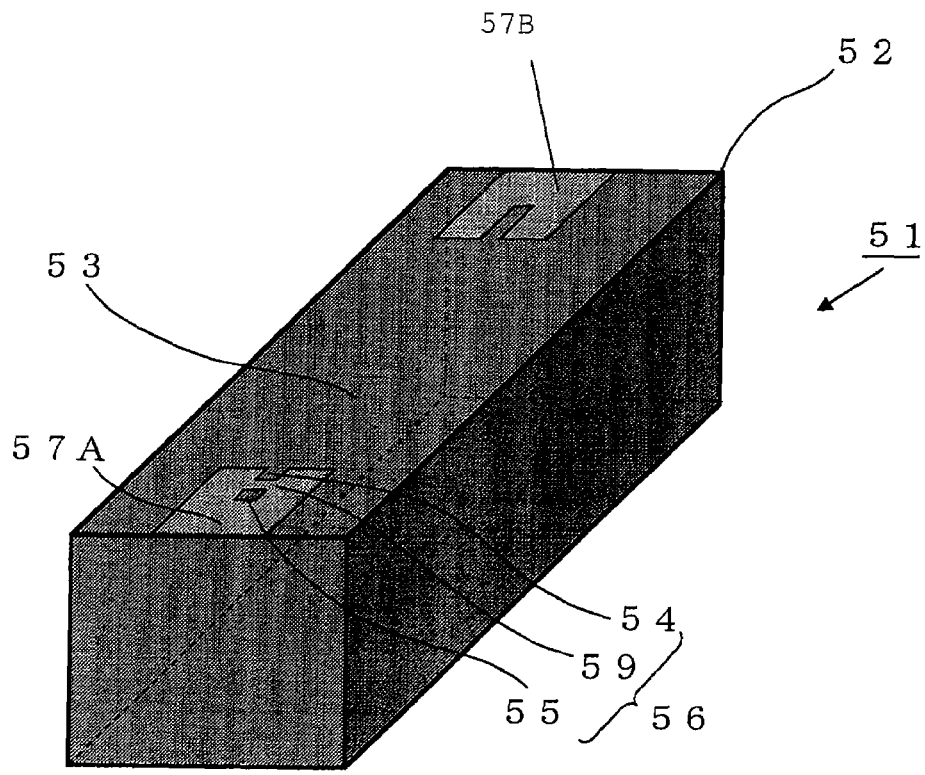
FIG. 7 shows the configuration of a dielectric resonator according to a third embodiment.

FIG. 7 shows a waveguide dielectric resonator 51 including a dielectric block 52 having a substantially rectangular parallelepiped shape. Openings 57A and 57B are disposed in positions that contact edge-circumference portions of a plane having a longitudinal direction of an outer-surface electrode 53 provided on substantially all over an outer surface of the dielectric block 52. A line pattern (input/output electrode) 56 whose one end is short-circuited and whose other end is open is provided in the opening 57A. The line pattern 56 includes an electrode gap 59. With the provision of the electrode gap 59, the line pattern 56 includes an input/output portion 55 and a ground portion 54.

The line pattern 56 and the electrode gap 59 have substantially the same shapes as the line pattern and the electrode gap described in the first embodiment.

Accordingly, the present invention can be implemented as in the above-described embodiment, even with the waveguide dielectric resonator 51. Each of the line pattern 56 and the electrode gap 59 may have any shape among the above-described shapes.

A voltage-controlled oscillator according to a fourth embodiment of the present invention will be described with reference to FIGS. 8 and 9.

Figure 8:
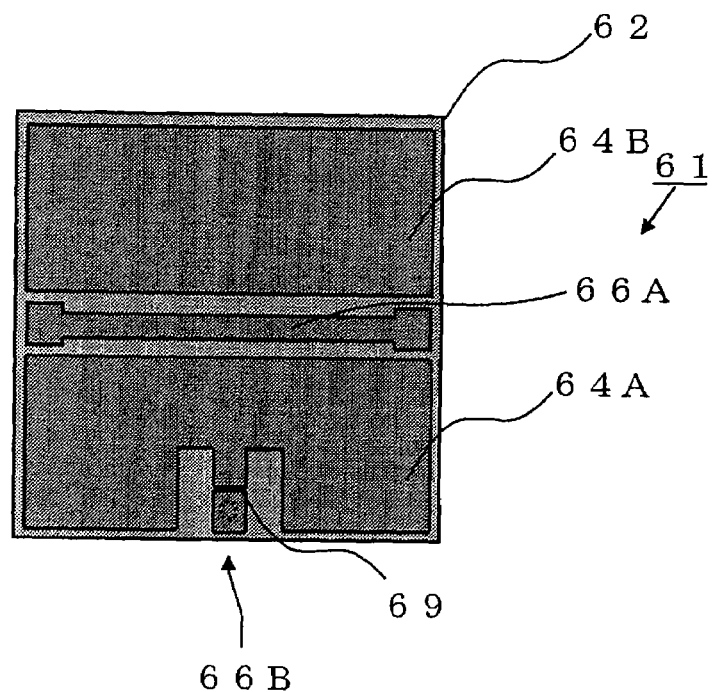
FIG. 8 shows the configuration of a dielectric resonator according to a fourth embodiment.
Figure 9:
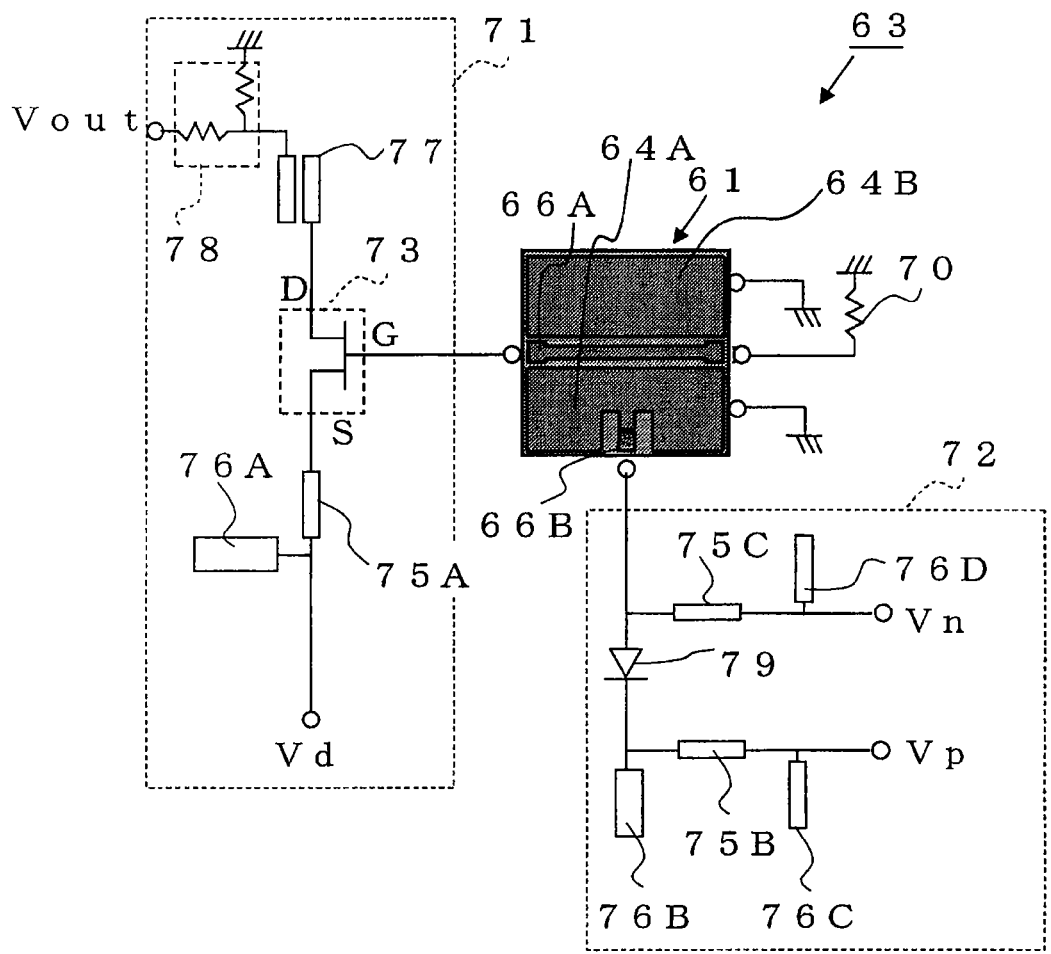
FIG. 9 is a circuit diagram of a voltage-controlled oscillator of a voltage control type according to the fourth embodiment.

FIG. 8 is a bottom view of a mount surface of a dielectric resonator 61. FIG. 9 is a circuit diagram of a voltage-controlled oscillator 63 in which the dielectric resonator 61 is disposed on a mount board.

In this embodiment, the dielectric resonator 61 has a configuration substantially similar to the dielectric resonator according to the first embodiment. However, the shapes of a rear-surface electrode 64 and a line pattern 66 provided on a mount-surface side are different from those in the first embodiment.

On the mount surface, a first line pattern 66A and a second line pattern 66B are provided. The line pattern 66A divides a rear-surface electrode into a first rear-surface electrode 64A and a second rear-surface electrode 64B. The line pattern 66B is connected to the rear-surface electrode 64A. In order to apply a DC-cut structure to the line pattern 66B, an electrode gap 69 is provided in the line pattern 66B. Although not illustrated here, the dielectric resonator 61 includes a substantially circular-shaped circular electrode that is provided on a top surface opposite to the mount surface and facing a mount board.

The line pattern 66A disposed on the mount surface extends linearly along the diameter of the circular electrode while passing through the vicinity of a central axis of the circular electrode. At both ends of the line pattern 66A (both ends in a lateral direction of the figure), large-width connection portions to which a signal line of the mount board is connected are formed. The connection portions are connected to the signal line of the mount board by a bump. In addition, the rear-surface electrodes 64A and 64B are provided on both sides in the width direction of the line pattern 66A on the mount-surface side of the dielectric member so as to be separated from each other. The rear-surface electrodes 64A and 64B are provided on the entire mount surface of the dielectric member, excluding the line patterns and openings near the line patterns.

When a high-frequency signal at a resonant frequency of the dielectric resonator 61 is input from the signal line to the line pattern 66A, a magnetic field is generated so as to coil itself on a plane perpendicular to a main direction of the line pattern 66A. In addition, a magnetic field is generated inside the dielectric member so as to coil itself on a plane perpendicular to the central axis of the circular electrode. The intensity of each of the two magnetic fields is changed between high intensity and low intensity for each half-wavelength. Positions of the magnetic fields that exhibit a high intensity correspond to each other, and positions of the magnetic fields that exhibit a low intensity correspond to each other. In addition, magnetic field vectors in a direction of an intersection line of a plane that is perpendicular to the line pattern 66A and that is perpendicular to the central axis of the circular electrode correspond to each other. Thus, the two magnetic fields are coupled to each other. Consequently, when one end of the line pattern 66A serves as a termination, the dielectric resonator 61 operates as a band-reflection-type resonator.

The line pattern 66B disposed on the mount surface has a configuration substantially similar to the line pattern described in the first embodiment. The line pattern 66B is located on the mount-surface side of the dielectric member and extends from an end-face side of the dielectric member toward the central portion of the dielectric member. The line pattern 66B is surrounded by a U-shaped opening (slit) in a width direction (in a longitudinal direction in the figure) and has a band-like shape (tongue-like shape). The end-face side of the line pattern 66B is surrounded by the opening and serves as an open end. A board side of the line pattern 66B serves as a short-circuited end connected to the rear-surface electrode 64A.

Since the rear-surface electrode 64A is connected to a ground electrode and is thus grounded, the board side of the line pattern 66B operates as a short-circuited point. The line pattern generates a high-intensity magnetic field in the short-circuited point. Due to the generated magnetic field, magnetic-field coupling between the dielectric resonator 61 and the line pattern 66B is achieved.

At this time, in the line pattern 66B, due to the transmission of a high-frequency signal from a signal line to the dielectric resonator 61, the potential of an electrode-gap portion changes in accordance with the high-frequency signal. Thus, a capacitance C is generated in the electrode-gap portion of the line pattern 66B. Since the capacitance is connected in series with the resonator, the reflection phase can be changed in accordance with the capacitance C. In addition, since the rear-surface electrode is grounded, a portion in which the line pattern 66B and the rear-surface electrode 64A are connected to each other serves as an equivalent ground point. Thus, the maximum magnetic field is generated in the vicinity of the ground point, and the line pattern 66B can be magnetic-field-coupled to the dielectric resonator 61.

The voltage-controlled oscillator 63 of a voltage control type is implemented when the dielectric resonator 61 having the above-described configuration is loaded to the mount board (not illustrated). The mount board is a substrate made of dielectric material. An amplifying circuit unit 71 including a field-effect transistor (hereinafter, referred to as an FET) 73, a microstrip line, and the like is provided on the mount board. When a power-supply voltage is supplied via a power-supply terminal Vd, a signal at a predetermined oscillating frequency set by the dielectric resonator 61 is oscillated and the signal is output through an output terminal Vout.

A gate terminal G of the FET 73 is connected to one end of the line pattern 66A, and a source terminal of the FET 73 is connected to a microstrip line 75A, which is a quarter-wavelength line. A matching stub 76A is connected to the microstrip line 75A on a side of the power-supply terminal Vd. In addition, a signal from a drain terminal D of the FET 73 passes through a coupled line 77 and an attenuator 78 for blocking a direct-current component and is output from the output terminal Vout.

Furthermore, the other end of the line pattern 66A of the dielectric resonator 61, which is not connected to the FET 73, is grounded through a termination resistor 70. Although not illustrated here, portions of signal lines on a side of the mount board to which the dielectric resonator is loaded are provided on a side of the FET 73 and a side of the termination resistor 70. The signal lines are connected to each other using the line pattern 66A. The rear-surface electrodes 64A and 64B are grounded to the ground electrode.

A frequency-control circuit unit 72 is also disposed on the mount board. The frequency-control circuit unit 72 is connected to the line pattern 66B of the dielectric resonator. In the frequency-control circuit unit 72, the anode of a variable-capacitance diode 79 is connected to the line pattern 66B. The cathode of the variable-capacitance diode 79 is connected to a matching stub 76B and a microstrip line 75B. Furthermore, a stub 76C, which is a quarter-wavelength line, and a positive control voltage input terminal Vp for applying a positive control voltage in order to adjust the junction capacitance of the variable-capacitance diode 79 are connected to the other end of the microstrip line 75B, which is not connected to the cathode of the variable-capacitance diode 79.

In addition, a microstrip line 75C is connected to the anode of the variable-capacitance diode 79. A stub 76D, which is a quarter-wavelength line, and a negative control voltage input terminal Vn for applying a negative voltage in order to adjust the junction capacitance of the variable-capacitance diode are connected to the other end of the microstrip line 75C, which is not connected to the anode of the variable-capacitance diode 79.

The voltage-controlled oscillator having the above-described configuration is provided. When a driving voltage is applied to the power-supply terminal Vd, a signal corresponding to a resonant frequency of the dielectric resonator 61 is input to the gate terminal G of the FET 73. Thus, the amplifying circuit unit 71 and the dielectric resonator 61 constitute an oscillating circuit. Then, the FET 73 amplifies and oscillates the signal corresponding to the resonant frequency of the dielectric resonator 61, and outputs the signal through the output terminal Vout.

In the frequency control circuit unit 72, a positive control voltage is applied to the positive control voltage input terminal Vp, and a negative control voltage is applied to the negative control voltage input terminal Vn. Although the negative control voltage input terminal Vn is connected to the dielectric resonator 61 as well as the variable-capacitance diode 79, since an electrode gap is provided in the line pattern 66B of the dielectric resonator 61 as described above, the electrode gap operates as a DC-cut circuit. This prevents the negative control voltage input terminal Vn from being grounded to the ground electrode of the mount board through the rear-surface electrode 64A of the dielectric resonator 61. Thus, a positive voltage is applied to the cathode of the variable-capacitance diode 79 and a negative voltage is applied to the anode of the variable-capacitance diode 79. The junction capacitance is set in accordance with the difference between the positive voltage and the negative voltage.

As described above, since a positive voltage is applied to the cathode of the variable-capacitance diode 79 and a negative voltage is applied to the anode of the variable-capacitance diode 79, even if the absolute value of a control voltage is low, a large differential voltage can be applied. Thus, the absolute value of the control voltage can be reduced.

A radar according to a fifth embodiment of the present invention will be described with reference to FIG. 10.

Figure 10:
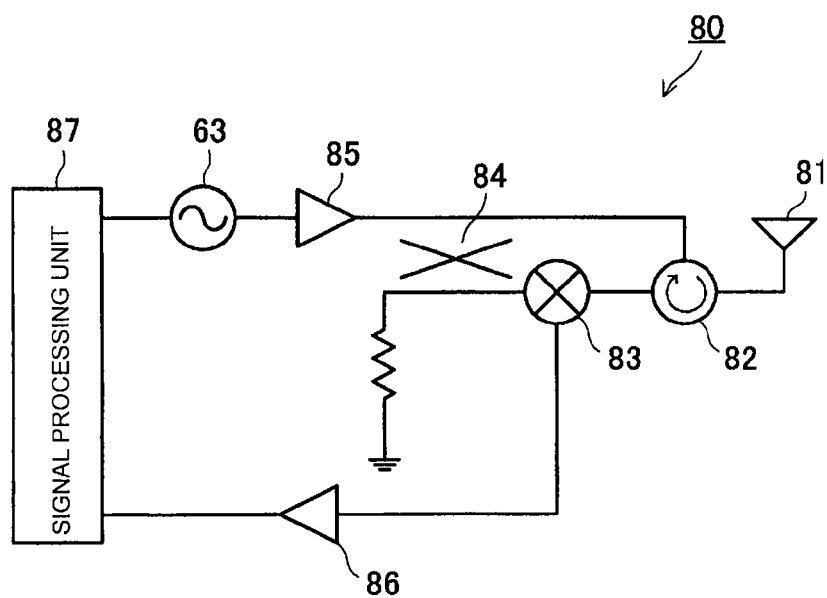
FIG. 10 is a circuit diagram of a radar according to a fifth embodiment.

FIG. 10 is a block diagram showing the entire configuration of a radar. A radar 80 includes the voltage-controlled oscillator 63, a power amplifier 85, a coupler 84, a circulator 82, an antenna 81, a mixer 83, a low-noise amplifier 86, a signal processing unit 87, and the like.

The voltage-controlled oscillator 63 is the same as the voltage-controlled oscillator described in the fourth embodiment. The power amplifier 85 amplifies a signal output from the voltage-controlled oscillator 63, and causes the amplified signal as a beam to pass through the circulator 82 and to be transmitted from the antenna 81 toward a detection direction. A reception signal generated when the antenna 81 receives a reflection wave from a target is input through the circulator 82 to the mixer 83. The mixer 83 receives a power-distribution signal of a transmission signal output from the coupler 84 as a local signal, and supplies a beat signal of the local signal and the reception signal to the low-noise amplifier 86. The low-noise amplifier 86 amplifies the beat signal and supplies the amplified beat signal as an intermediate-frequency signal to the signal processing unit 87. The signal processing unit 87 supplies a voltage signal having a triangular wave shape to the voltage-controlled oscillator 63 so that the voltage-controlled oscillator 63 can modulate an oscillating signal in a triangular wave manner. In addition, the signal processing unit 87 converts the intermediate-frequency signal into a digital-data sequence and performs FFT processing on the digital-data sequence to obtain a frequency spectrum of the intermediate-frequency signal. Accordingly, in accordance with the obtained frequency spectrum, the distance to the target and the relative speed with respect to the target are detected.

When the radar 80 is configured using the voltage-controlled oscillator 63 according to the present invention as described above, the variation in the electric characteristics according to the radar 80 can be reduced. In addition, the manufacturing cost can be reduced.

The voltage-controlled oscillator according to the present invention can be applied to a communication apparatus using, for example, a millimeter-wave band, as well as the above-described radar. In this case, unlike a case where a beat signal of a transmission signal and a reception signal is used as in radars, a reception signal may be amplified using a low-noise amplifier and a reception circuit may perform processing on the reception signal.

The invention claimed is:

1. A dielectric resonator comprising:
   a dielectric member;
   an electrode provided on an outer surface of the dielectric member; and
   a line pattern having a first end that is short-circuited with respect to the electrode and a second end that is open with respect to the electrode, the line pattern being provided on a portion of the outer surface of the dielectric member,
   wherein the line pattern includes an electrode gap that divides the line pattern into a signal input/output portion provided on the second end that is open with respect to the electrode, and a ground portion provided on the first end that is short-circuited with respect to the electrode.

2. The dielectric resonator according to claim 1, wherein a main-direction-length of each of portions of the line pattern in which the signal input/output portion has a protruding shape, and a length of the protruding shape in a portion that faces the ground portion with the electrode gap therebetween is smaller than one quarter of a wavelength of a resonant signal of the resonator.

3. The dielectric resonator according to claim 1, further comprising a second electrode provided on a second surface of the dielectric member opposite the outer surface.

4. The dielectric resonator according to claim 3, wherein the second electrode is a circular electrode.

5. The dielectric resonator according to claim 4, wherein the circular electrode includes slits shaped and disposed so as to set a resonant frequency.

6. The dielectric resonator according to claim 1, wherein a position of the electrode gap corresponds to a ground point.

7. The dielectric resonator according to claim 1, wherein the entire electrode gap is included in the line pattern.

8. The dielectric resonator according to claim 1, wherein the electrode gap defines a protruding portion that extends into a portion of the electrode.

9. The dielectric resonator according to claim 1, wherein the electrode gap has a shape defining a recess in the signal input/output portion and a protrusion in the ground portion.

10. The dielectric resonator according to claim 1, wherein the electrode gap has a meander-line shape.

11. The dielectric resonator according to claim 1, wherein the electrode gap has a step shape.

12. The dielectric resonator according to claim 1, wherein the electrode gap has an angular shape.

13. The dielectric resonator according to claim 1, wherein the line pattern is a first line pattern and the dielectric resonator further includes a second line pattern that divides the electrode into parts.

14. The dielectric resonator according to claim 13, wherein ends of the second line pattern are larger in width than a center portion thereof.

15. A voltage-controlled oscillator comprising:
   a main line connected to the dielectric resonator according to claim 1;

a negative resistance element connected to the main line;
a variable-capacitance element connected to the signal input/out portion by a line; and
a control voltage portion that applies a positive potential to a first end of the variable-capacitance element and that applies a negative potential to a second end of the variable-capacitance element.

16. A wireless apparatus comprising a high-frequency signal generator containing the voltage-controlled oscillator according to claim 15.

* * * * *